(12) United States Patent
Sia et al.

(10) Patent No.: US 8,686,758 B1
(45) Date of Patent: Apr. 1, 2014

(54) INTEGRATED CIRCUIT WITH CONFIGURABLE I/O TRANSISTOR ARRANGEMENT

(75) Inventors: Ket Chiew Sia, Bayan Lepas (MY); Choong Kit Wong, Sungai Ara (MY); Boon Jin Ang, Butterworth (MY)

(73) Assignee: Altera Corporation, San Jose, CA (US)

( * ) Notice: Subject to any disclaimer, the term of this patent is extended or adjusted under 35 U.S.C. 154(b) by 13 days.

(21) Appl. No.: 12/423,777

(22) Filed: Apr. 14, 2009

(51) Int. Cl.
*H03B 1/00* (2006.01)
*H03K 3/00* (2006.01)
*H03K 17/56* (2006.01)
*H03K 17/687* (2006.01)
*H03K 19/094* (2006.01)

(52) U.S. Cl.
USPC ........... 327/108; 327/112; 327/426; 327/436; 327/437; 326/82; 326/83; 326/87

(58) Field of Classification Search
USPC ............ 327/108, 112, 427, 436, 437; 326/82, 326/83, 87
See application file for complete search history.

(56) References Cited

U.S. PATENT DOCUMENTS

| | | | |
|---|---|---|---|
| 5,391,939 A * | 2/1995 | Nonaka | 326/83 |
| 7,405,588 B2 * | 7/2008 | Kawahara et al. | 326/38 |
| 7,463,073 B2 * | 12/2008 | Chung et al. | 327/112 |

* cited by examiner

*Primary Examiner* — Lincoln Donovan
*Assistant Examiner* — Colleen O Toole
(74) *Attorney, Agent, or Firm* — Womble Carlyle Sandridge & Rice LLP

(57) ABSTRACT

I/O circuits and a method for transmitting different types of I/O signals are disclosed. An embodiment of the I/O circuit comprises multiple transistors with multiple switches coupled to the transistors. The switches may be used to selectively couple the transistors to a power source or to another transistor to form different transistor configurations. The transistors may be configured to form a parallel configuration or a stacked configuration. Stacking up transistors may reduce voltage swings in the transistors and subsequently reduce degradation in the transistors.

24 Claims, 7 Drawing Sheets

US 8,686,758 B1

INTEGRATED CIRCUIT WITH CONFIGURABLE I/O TRANSISTOR ARRANGEMENT

BACKGROUND

Transistors used in ICs are susceptible to degradation due to frequent voltage swings. "Wear-out" tests are generally carried out on semiconductor devices to test the reliability of a device and the hot carrier-induced (HCI) degradation test is an example of such a "wear-out" test. In deep sub-micron technology, certain input/output (I/O) standards become more sensitive to HCI degradation. In some I/Os, the degradation is caused by voltage swings at the output transistors. As a consequence, the saturation drive current, i.e., the IDsat of a transistor, degrades significantly after constant operation under such condition.

The degradation would subsequently affect the performance and reliability of a device. In order to reduce the gradual degradation of the transistors, the electric field or voltage swing needs to be removed or at least reduced. One way to reduce the electric field seen across the source and drain terminals of a transistor is to stack up multiple transistors in order to divide the high voltage seen in an individual transistor among several transistors. This way, the voltage drop across any one transistor can be reduced. For example, when four transistors are stacked between a 12-volt power supply and ground, the average voltage across each transistor is only 3 volts. Because the transistors do not need to handle constant sudden voltage swings, their performance can be maintained for a much longer period of time.

Consequently the lifespan of an IC or a device can be substantially lengthened because of the reduced degradation in transistors. However, I/Os in an IC generally support different drive strengths and merely stacking up transistors just to support a particular I/O standard or drive strength is not efficient and may unnecessarily affect the performance of the I/Os.

Therefore, it is desirable to have an IC with transistors that can be configured to support a higher drive strength with a high voltage swing without significantly affecting the performance and reliability of the device. It is also desirable to have a mechanism that reduces performance degradation without sacrificing area or incurring additional cost.

SUMMARY

Embodiments of the present invention include circuits and a method for reducing voltage swing in an integrated circuit (IC).

It should be appreciated that the present invention can be implemented in numerous ways, such as a process an apparatus, a system, a device or a method on a computer readable medium. Several inventive embodiments of the present invention are described below.

In one embodiment, an I/O circuit is disclosed. The I/O circuit includes multiple transistors coupled to a number of switches. Some of the switches are coupled to the source of a few of the transistors while some others are coupled to the drain of some of the transistors. The switches selectively couple the source and drain of the transistors to different signals based on the I/O standard being transmitted. In one embodiment, the transistors include a number of PMOS and NMOS transistors and the switches connect the PMOS and NMOS transistors in a specific manner according to the I/O signal being transmitted by the I/O circuit.

In another embodiment, another I/O circuit is disclosed. The I/O circuit has numerous transistors with a number of programmable switches and a few biasing circuits to provide a desirable voltage level to drive some of the transistors when necessary. The switches selectively couple the gate of the transistors either to the biasing circuits or pull-up/pull-down pre-drivers. In one embodiment, the switches are metal programmable switches that can be used to connect the transistors in the I/O circuit in a stacked configuration based on the I/O signals being transmitted.

In yet another embodiment in accordance with the present invention, a method for transmitting different types of I/O signal is disclosed. The type of I/O signal to be transmitted is determined and a set of switches are set or configured to accommodate either a stacked transistor configuration or a parallel transistor configuration depending on the type of I/O signal being transmitted. A different signal is also transmitted through a second set of switches based on the type of I/O signal being transmitted.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and a method for reducing voltage swing in an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC with configurable transistor arrangements, which ensure that the voltage swing across any one of certain transistors in the I/O does not unduly degrade the transistor. More specifically, the various embodiments allow transistors in the IC to be configured in, for example, a stacked or parallel arrangement, based on the type of I/O standard in use. For example, I/O standards that require higher drive strengths will generally create a larger voltage swing. Previously, this would inevitably cause transistors that experience the full extent of such voltage swings to degrade significantly. The embodiments described herein address this issue by configurably spreading the voltage swings across two or more transistors. Conversely, I/O standards that do not require higher drive strengths will generally create a smaller voltage swing. Such I/O standards do not require a stacked transistor arrangement. In fact, use of a stack transistor arrangement with such I/O standards, i.e., I/O standards that do not require higher drive strength, is generally not employed because the stack transistor arrangement may adversely affect speed and performance. While stacked transistors can be used for I/O standards that do not require higher drive strength, in one embodiment, a parallel configuration is preferred for such I/O standards because transistors in a parallel configuration are closer to output pins and as such may offer speed and performance benefits as propagation paths are shorter in a parallel arrangement compared to a stacked arrangement.

Thus, the following embodiments provide a technique for transistors to be configured based on the I/O standard being transmitted in order to lengthen the lifespan of the transistors and subsequently, that of the circuit and at the same time, maintain circuit performance. Switches are used in the IC to configure transistors in, for example, a stacked or parallel configuration based on the drive strength that the IC is transmitting at any one time. Switches discussed herein can refer to resettable or one-time programmable switches and to poly-fuse switches, antifuses, programmable metal switches, via switches, etc or any other type of configurable switch capable of selecting the desired transistor arrangement. The switches may be configured by setting a configuration random access memory bit in one embodiment.

Figure 1:
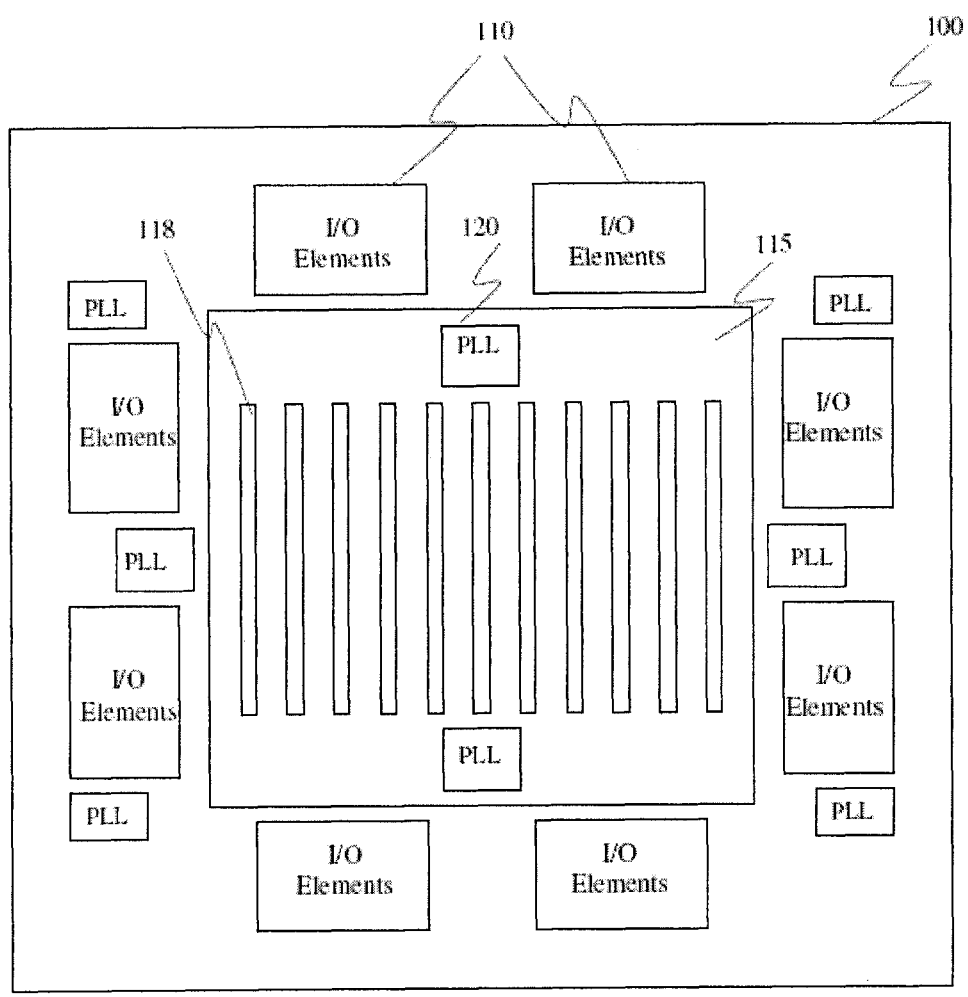
FIG. 1, meant to be illustrative and not limiting, shows an embodiment of a programmable device in accordance with the present invention.

FIG. 1, meant to be illustrative and not limiting, shows an embodiment of a programmable device 100 in accordance with the present invention. Programmable device 100 includes logic region 115 and 110 elements 110. Other auxiliary circuits such as phase-locked loops (PLLs) 120 for clock generation and timing, can be placed in between I/O elements 110 and other unoccupied areas in logic region 115 and in the periphery of programmable device 100 as shown in FIG. 1. Logic region 115 may be filled with logic cells that include, among other things, at the most basic level, "logic elements" (LEs). LEs may include look-up table-based logic regions and these logic elements may be grouped into "Logic Array Blocks" (LABs). The logic elements and groups of logic elements or LABs can be configured to perform logical functions desired by the user. In the embodiment shown, region 115 also includes a plurality of embedded memory blocks 118. Each of the memory blocks 118 may have a different size. For example, some of the memory blocks may be medium-embedded-memory (MEAB) blocks while others may be mega-RAM (MRAM) blocks.

I/O elements 110 are preferably located around logic region 115 and the perimeter of programmable device 100. I/O elements 110 may support a variety of single-ended and differential I/O standards. Some examples of single-ended I/O standards include low-voltage transistor transistor logic (LVTTL), high-speed transceiver logic (HSTL), low-voltage complementary metal oxide semiconductor (LVCMOS), etc. These I/O standards usually use voltage levels like 1.5V, 1.8V, 2.5V and 3.3V. Each I/O element or I/O bank 110 can usually be configured to operate at a particular voltage. A single device like programmable device 100 can potentially support a variety of different interfaces and each individual I/O bank 110 can support a different I/O standard with a different voltage level.

Figure 2:
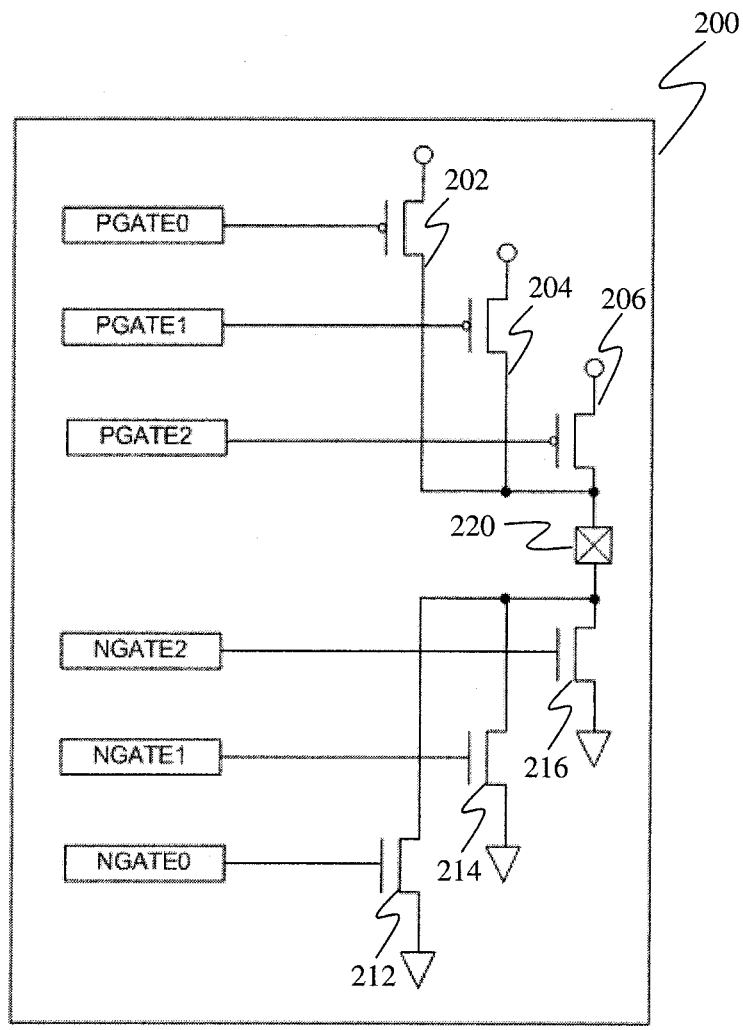
FIG. 2, meant to be illustrative and not limiting, shows a typical I/O circuit with multiple transistors.

FIG. 2, meant to be illustrative and not limiting, shows a typical I/O circuit 200 with multiple transistors connected to I/O pin 220. Transistors 202, 204, and 206 are p-channel metal-oxide-semiconductor field-effect (PMOS) transistors while transistors 212, 214 and 216 are n-channel metal-oxide-semiconductor field-effect (NMOS) transistors. The source of each of PMOS transistors 202, 204 and 206 is coupled to a power source. In an exemplary embodiment, the power source is a voltage level, e.g., Vdd. The drain of each of PMOS transistors 202, 204 and 206 are coupled to I/O pin 220. Pull-up pre-drivers, PGATE0, PGATE1 and PGATE2, are coupled to the gate of transistors 202, 204 and 206 respectively to drive each of the transistors.

Still referring to FIG. 2, the source of transistors 212, 214 and 216 are coupled I/O pin 220 and a power source is coupled to the drain of transistors 212, 214 and 216. In an exemplary embodiment, the power source supplies a ground potential to the drain of transistors 212, 214 and 216. Transistors 212, 214 and 216 are driven by pull-down pre-drivers, NGATE0, NGATE1 and NGATE2 respectively. I/O circuit 200 may be an I/O circuit in an I/O bank within a programmable device like programmable device 100 in FIG. 1. In an exemplary embodiment, I/O pin 220 sends data from I/O circuit 200 to an external circuit or device. It should be appreciated that I/O pin 220 can also receive data from an external source.

Figure 3:
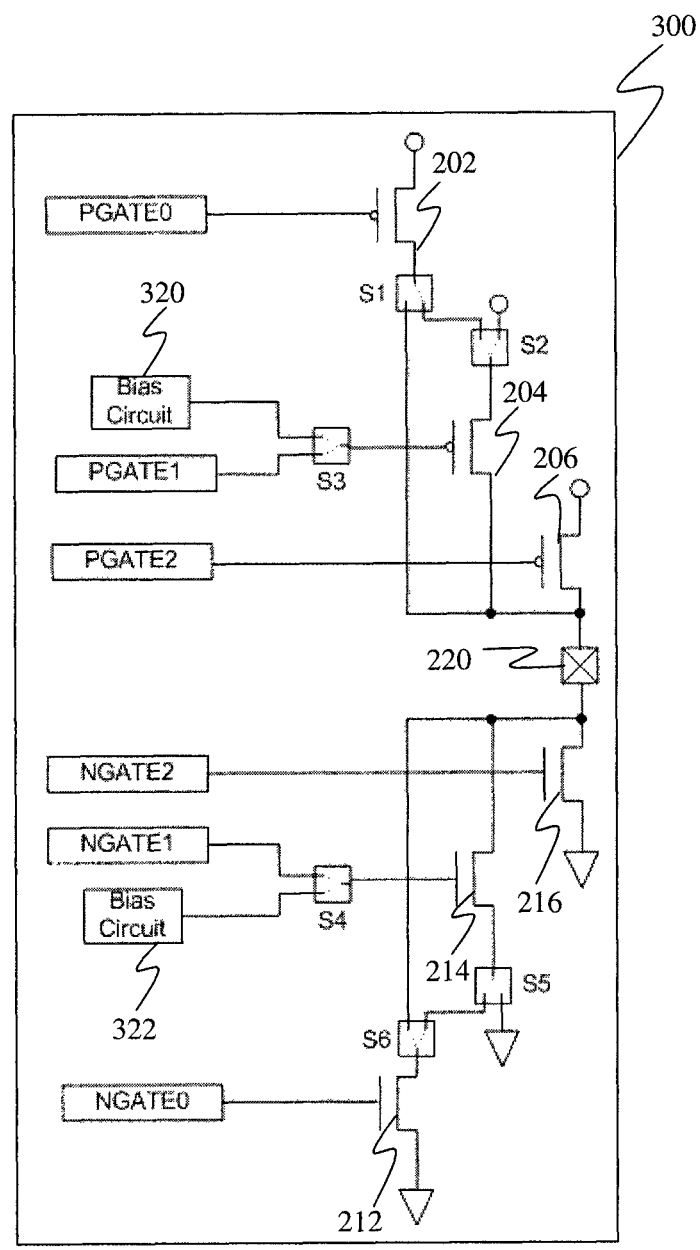
FIG. 3, meant to be exemplary and not limiting, shows an I/O circuit with multiple switches and biasing circuits as an embodiment of the present invention.

FIG. 3, meant to be exemplary and not limiting, shows I/O circuit 300 with multiple switches and bias circuits as an embodiment of the present invention. Switch S1 is coupled to the drain of transistor 202 to selectively couple the drain of transistor 202 to either I/O pin 220 or the source of transistor 204. The connection to the source of transistor 204 is controlled by switch S2 as switch S2 selectively couples the source of transistor 204 to either the drain of transistor 202 or a power source. In one embodiment, the power source supplies a voltage level to the source of transistor 204. The gate of transistor 204 is coupled to yet another switch, i.e., switch S3, which selectively couples either biasing circuit 320 or pull-up pre-driver PGATE1 to the gate of transistor 204. In one embodiment, biasing circuit 320 supplies a pre-determined voltage level to drive transistor 204 when the transistors in I/O circuit 300 are placed in a stacked configuration.

Similarly, switch S4 is coupled to the gate of transistor 214 to connect either biasing circuit 322 or pull-down pre-driver NGATE1 to the gate of transistor 214. In one embodiment, biasing circuits 320 and 322 are similar and supply a similar voltage level to each of transistors 204 and 214. In another embodiment, biasing circuits 320 and 322 are different circuits. The drain of transistor 214 is coupled to switch S5 which selectively couples the drain of transistor 214 to either a power source or the source of transistor 212. In one embodiment, the power source is a ground potential. Switch S6 selectively couples the source of transistor 212 to either I/O pin 220 or the drain of transistor 214 through switch S5.

In one embodiment, switches S1, S2, S3, S4, S5 and S6 are metal programmable switches in via and metal layers of a programmable device and as such, are configured or connected through the vias. One skilled in the art should appreciate that switches S1, S2, S3, S4, S5 and S6 can be programmed using CRAM bits. In an exemplary embodiment, CRAM bits are used to store configuration information for each of the switches S1-S6 based on the voltage level of signal being transmitted to I/O pin 220. In another embodiment, I/O circuit 300 is a circuit within a PLD and I/O pin 220 is a pin on the PLD, and the switches in I/O circuit 300 are programmed by a software utility used to configure the PLD. In such an embodiment, a specific I/O standard with a specific voltage level is selected using the software utility. The software utility then generates an appropriate configuration file for the PLD based on the selection. Switches S1, S2, S3, S4, S5 and S6 in I/O circuit 300 are configured to either connect transistors 202, 204 and 206 and transistors 212, 214 and 216 in a stacked configuration or a parallel configuration based on the voltage level of the I/O standard being transmitted. One skilled in the art should also appreciate that there may be a few I/O circuits like I/O circuit 300 in a PLD and each I/O circuit 300 may be configured to transmit a different I/O standard. Other blocks of such a device are not shown or described so as not to obscure the present invention. Therefore, the switches in I/O circuit 300 are configured in a specific manner depending on the I/O signal, or rather, the voltage of the I/O signal being transmitted, details of which are shown in FIGS. 4A and 4B and explained in the following paragraphs.

Figure 4A:
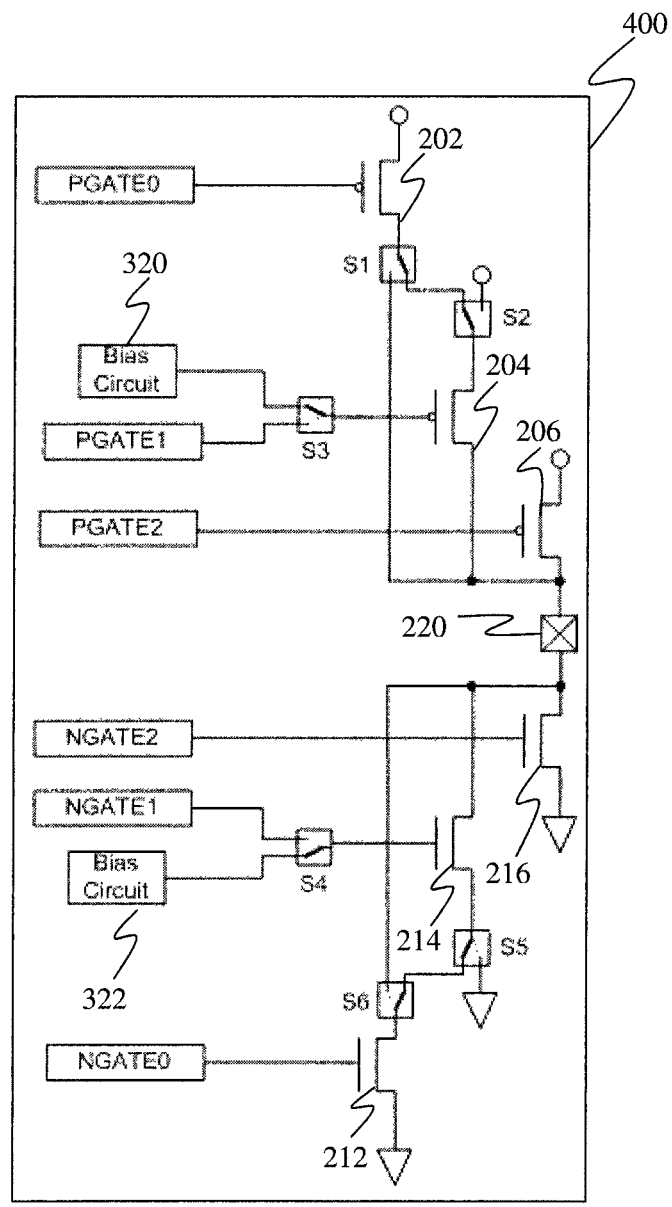
FIG. 4A, meant to be illustrative and not limiting, shows an I/O circuit with switches configured to form a stacked transistor configuration as one embodiment of the present invention.

FIG. 4A, meant to be illustrative and not limiting, shows I/O circuit 400 with switches configured to form a stacked transistor configuration as one embodiment of the present invention. In the embodiment of FIG. 4A, transistors in I/O circuit 400 are stacked when transmitting I/O signals at 3.3V or higher voltage. Switch S1, coupled to the drain of transistor 202, is configured to connect the drain of transistor 202 to the source of transistor 204 through switch S2. Therefore, in one embodiment, the configuration of switch S2 is consistent with the configuration of switch S1. Switch S3 selects and transmits a voltage level from biasing circuit 320 to the gate of transistor 204 to drive transistor 204.

Still referring to FIG. 4A, switch S5 connects the drain of transistor 214 to the source of transistor 212 through switch S6. Switch S4, coupled to the gate of transistor 214, couples bias circuit 322 to the gate of transistor 214 to drive transistor 214. In an exemplary embodiment, bias circuits 320 and 322 supply a consistent voltage level to drive transistors 204 and 214 respectively. For example, if I/O circuit 400 is configured such that I/O pin 220 is driving a 3.3V I/O signal, then bias circuits 320 and 322 would supply approximately 1.65V, i.e., half of the total voltage, to drive transistors 204 and 214. However, this is meant to be exemplary and not limiting. One skilled in the art should appreciate that biasing circuits 320 and 322 can be built to supply any voltage value that best serves the purpose of I/O circuit 400. Therefore, in the embodiment of FIG. 4A, I/O signals are transmitted through stacked transistors 202, 204, 212 and 214 to I/O pin 220. The stacked configuration allows the voltage of the I/O signal transmitted to be distributed across the transistors in I/O circuit 400. In one embodiment, transistors 206 and 216 are disabled by a software utility used to configure I/O circuit 400. In another embodiment, transistors 206 and 216 are removed from I/O circuit 400 based on the voltage level of the I/O signals being transmitted by I/O circuit 400. In yet another embodiment, transistors 206 and 216 are not removed and are stacked up with transistors 202 and 204 and with transistors 212 and 214, respectively.

Figure 4B:
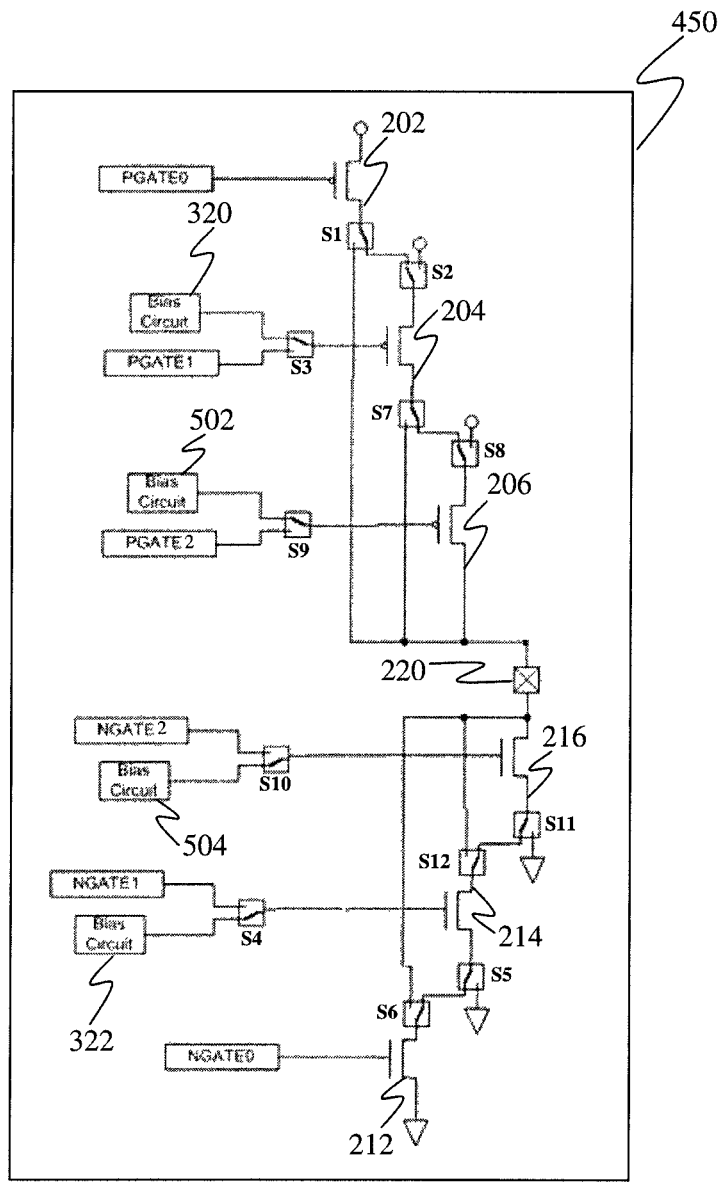
FIG. 4B, meant to be illustrative and not limiting, shows an I/O circuit configured with all the transistors stacked up as another embodiment in accordance with the present invention.

FIG. 4B, meant to be illustrative and not limiting, shows I/O circuit 450 configured with all the transistors stacked up as another embodiment in accordance with the present invention. Transistors 206 and 216 are not disabled or removed in the configuration shown in I/O circuit 450. Instead, additional switches and biasing circuits are used to form a longer stack of transistors. Switch S7 couples the drain of transistor 204 to the source of transistor 206 through switch S8. An additional biasing circuit, i.e., biasing circuit 502, is coupled to the gate of transistor 206 through switch S9. Similarly, another additional biasing circuit, biasing circuit 504, is connected to the gate of transistor 216 through switch S10. The drain of transistor 216 is coupled to the source of transistor 214 through switches S11 and S12 to stack transistor 216 up with transistors 214 and 212. In one embodiment, biasing circuits 320 and 322 supply one voltage level to transistors 204 and 214 while biasing circuits 502 and 504 supply another voltage level to transistors 206 and 216. In an exemplary embodiment, the voltage level supplied by biasing circuits 502 and 504 is higher than the voltage level supplied by biasing circuits 320 and 322.

As an illustrative example, if I/O circuit 500 is transmitting a 3.3V I/O standard, biasing circuits 320 and 322 would supply approximately 1.1V, or about ⅓ of the total voltage, to drive transistors 204 and 214 while biasing circuits 502 and 504 would supply approximately 2.2V, or about ⅔ of the total voltage, to drive transistors 206 and 216 so that each of all the transistors in I/O circuit 500 will get about ⅓ of the total voltage. A higher voltage is generally needed at the end of the stacked configuration to drive the whole chain of transistors. Therefore, in this embodiment, biasing circuits 502 and 504 supply a higher voltage to drive transistors 206 and 216 compared to biasing circuits 320 and 322. In one embodiment, how much voltage passes through each transistor is based on the voltage level of the I/O signal being transmitted and the total number of stacked transistors. Even though only a few transistors are shown in I/O circuit 500, one skilled in the art should appreciate that more transistors can be used and different I/O circuits may have a different number of transistors.

Figure 4C:
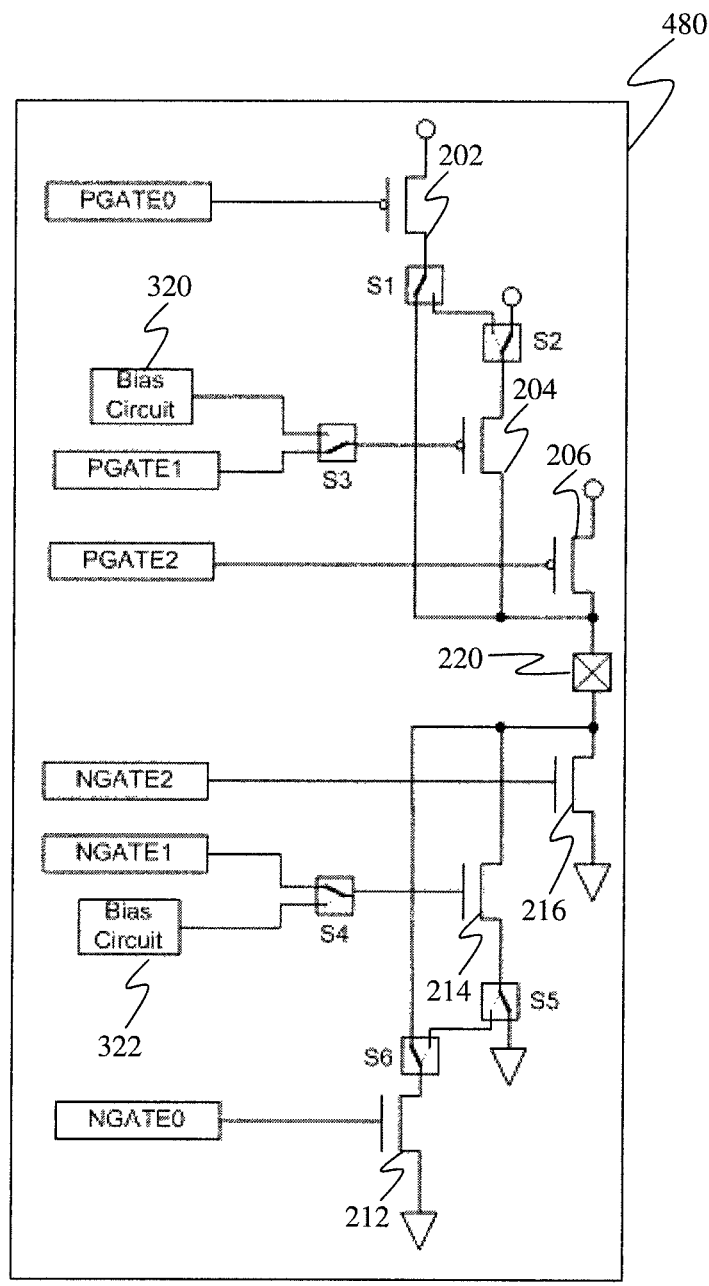
FIG. 4C, meant to be illustrative and not limiting, shows an I/O circuit with switches configured to form a parallel transistor configuration as yet another embodiment of the present invention.

FIG. 4C, meant to be illustrative and not limiting, shows I/O circuit 480 with switches configured to form a parallel transistor configuration as one embodiment of the present invention. In the embodiment illustrated in FIG. 4C, I/O circuit 480 is configured to transmit an I/O signal with a voltage level lower than 3.3V. Therefore, I/O circuit 480 generally functions like a typical I/O circuit as that shown in FIG. 2. Switch S1 is configured to connect the drain of transistor 202 to I/O pin 220. Switch S2, coupled to the source of transistor 204, connects a power source, i.e., a voltage level, to the source of transistor 204. The gate of transistor 204 is coupled to pull-up pre-driver PGATE1 through switch S3. Similarly, the gate of transistor 214 is coupled to pull-down pre-driver NGATE1 through switch S4. Switch S5 is configured to connect the drain of transistor 214 to a ground potential while switch S6 is configured to connect the source of transistor 216 to I/O pin 220. In one embodiment, transistors 202, 204 and 206 are driven by pull-up pre-drivers PGATE0, PGATE1 and PGATE2 respectively, and transistors 212, 214 and 216 are driven by pull-down pre-drivers NGATE0, NGATE1 and NGATE2 respectively. Therefore, programmable switches placed in I/O circuits as shown in FIGS. 4A, 4B and 4C can be used to connect transistors 202, 204, 206, 212, 214 and 216 in a specific configuration to reduce transistor degradation.

Figure 5:
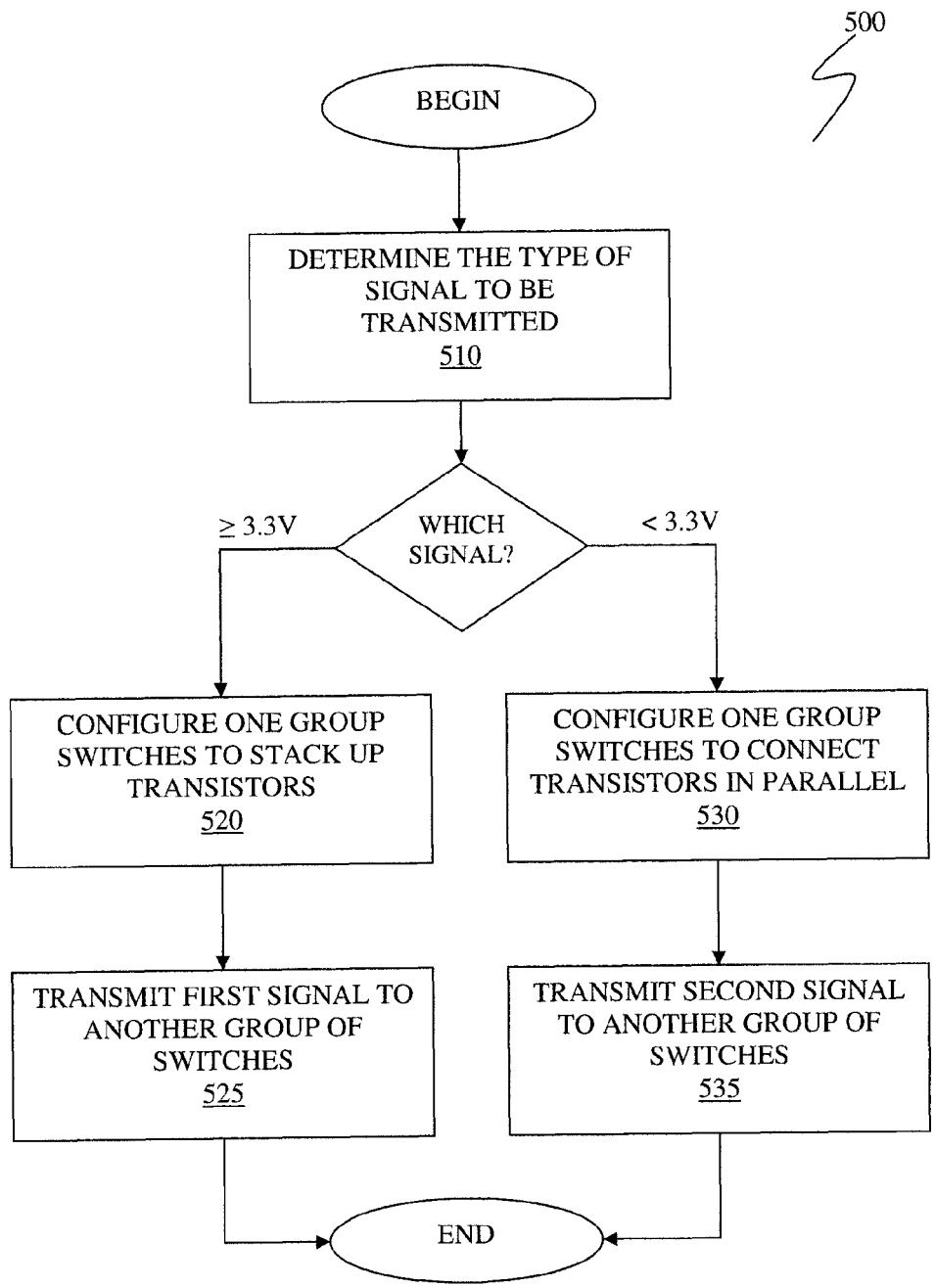
FIG. 5, meant to be illustrative and not limiting, shows a method flow for transmitting different types of I/O signals as an embodiment of the present invention.

FIG. 5, meant to be illustrative and not limiting, shows method flow 500 for transmitting different types of I/O signals as another embodiment of the present invention. The type of I/O signal to be transmitted is determined in operation 510. In one embodiment, one type of I/O signal is an I/O signal below 3.3V and another type of I/O signal is an I/O signal that is driven by a 3.3V or more voltage level. After the type of I/O signal to be transmitted is determined, a group of switches are configured accordingly. If the I/O signal to be transmitted operates at 3.3V or higher voltage, then the switches are configured to stack up the transistors in the I/O circuit in operation 520. A separate signal is then transmitted to another group of switches in operation 525. In one embodiment, the signal transmitted may be a pre-determined voltage level supplied by a biasing circuit. In another embodiment, the I/O circuit with the switches configured this way is similar to circuit 450 shown in FIG. 4A.

Still referring to method flow 500 of FIG. 5, if the I/O signal to be transmitted operates below 3.3V, then the switches are configured to connect the transistors in the I/O circuit in a parallel configuration in operation 530. Similarly, a different signal is then transmitted to another group of switches in operation 535. In one embodiment, the signal transmitted is transmitted from either a pull-up or pull-down pre-driver to the gate of the transistors. In another embodiment, the I/O circuit with the switches configured to connect the transistors in a parallel configuration is similar to circuit 480 shown in FIG. 4C.

I/O circuits that include a mechanism to connect transistors in a different manner, i.e., connecting transistors in a stacked or parallel configuration based on the type of I/O signals being transmitted at any one time, may have a considerably longer lifespan than a typical I/O circuit with a standard unalterable transistors configuration. Because the switches used do not usually take up much space in a device, using switches to create a configurable transistor stack when needed is a viable and effective solution that reduces voltage swing and transistor degradation in the device.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An I/O circuit, comprising:
a first transistor having a drain coupled to a first switch, wherein the first switch selectively couples the first transistor to one of an I/O pin or one of a plurality of inputs of a second switch, wherein the first switch includes a single input and multiple outputs, and wherein the second switch includes a single output;
a second transistor, wherein a source of the second transistor is coupled to the single output of the second switch, wherein the second switch selectively couples the second transistor to the first transistor through the one of the plurality of inputs of the second switch and the first switch;
a third transistor having a source coupled to the I/O pin and a drain coupled to a third switch, wherein the third switch selectively couples the third transistor to one of a ground potential through a first output of the third switch or a first input of a fourth switch through a second output of the third switch, so that the third and fourth switches are configured for being selectively in series with one another; and
a fourth transistor having a source coupled to an output of the fourth switch, wherein the fourth switch selectively couples the fourth transistor to one of the I/O pin or the third transistor.

2. The I/O circuit of claim 1, further comprising:
a fifth switch coupled to a gate of the second transistor, wherein the fifth switch selectively couples one of a pre-determined voltage level or a pull-up pre-driver to the gate of the second transistor.

3. The I/O circuit of claim 2, wherein the pre-determined voltage level is supplied by a biasing circuit.

4. The I/O circuit of claim 2, further comprising:
a sixth switch coupled to a gate of the third transistor, wherein the sixth switch selectively couples one of a pre-determined voltage level or a pull-down pre-driver to the gate of the third transistor.

5. The I/O circuit of claim 4, wherein the pre-determined voltage level is supplied by a biasing circuit.

6. The I/O circuit of claim 1, wherein the first and second transistors are PMOS transistors.

7. The I/O circuit of claim 1, wherein the third and fourth transistors are NMOS transistors.

8. The I/O circuit of claim 1, wherein the I/O pin is an output pin.

9. A programmable logic device (PLD) comprising the I/O circuit of claim 1, wherein the I/O circuit is a 3.3V I/O pin on the PLD.

10. An I/O circuit, comprising:
first, second, third and fourth switches, wherein each of the first, second and third switches has an output, a first input, and a second input, and wherein each of the first, second and third switches is configured for selecting between the first input and the second input;

a first transistor, wherein a source of the first transistor is coupled to the output of the first switch, a gate of the first transistor is coupled to the output of the second switch, and a drain of the first transistor is coupled to an output pin;

a first biasing circuit coupled to the first input of the second switch;

a second transistor, wherein a source of the second transistor is coupled to the output pin, a gate of the second transistor is coupled to the output of the third switch, and a drain of the second transistor is coupled to the fourth switch; and a second biasing circuit coupled to the first input of the third switch, wherein the second input of the second switch is coupled to a pull-up pre-driver and wherein the second input of the third switch is coupled to a pull-down pre-driver, wherein received input signals at the second input of the second switch and the second input of the third switch are capable of being transmitted through the second switch and the third switch, respectively.

11. The I/O circuit of claim 10, wherein the first transistor comprises a pull-up transistor and the second transistor comprises a pull-down transistor.

12. The I/O circuit of claim 10, further comprising:
a third transistor coupled to the first input of the first switch; and
a fourth transistor coupled to a first output of the fourth switch.

13. The I/O circuit of claim 12, wherein the second input of the first switch is coupled to a voltage level and wherein a second output of the fourth switch is coupled to a ground potential.

14. The I/O circuit of claim 10, wherein the first and second biasing circuits are identical circuits.

15. The I/O circuit of claim 10, wherein the first biasing circuit provide a first pre-determined voltage level to the first transistor and the second biasing circuit provide a second pre-determined voltage level to the second transistor.

16. The I/O circuit of claim 10, wherein the first, second, third and fourth switches are programmable metal switches.

17. A method of transmitting different types of I/O signals, comprising:
determining a type of I/O signal to be transmitted based on a voltage level of the I/O signal;
setting a first set of switches to accommodate a stacked transistor configuration when transmitting a first type of I/O signal having a first operating voltage, the stacked transistor configuration having multiple transistors coupled in series through the first set of switches, wherein the first set of switches includes a first switch coupled to a second switch, the first switch having a single input and multiple outputs, the second switch having multiple inputs and a single output, wherein one of the multiple outputs of the first switch is coupled to one of the multiple inputs of the second switch;

setting the first set of switches to accommodate a parallel transistor configuration when transmitting a second type of I/O signal having a second operating voltage, wherein the parallel transistor configuration is inconsistent with the first type of I/O signal;

transmitting a first signal through a second set of switches when transmitting the first type of I/O signal, wherein the first type of I/O signal traverses through multiple switches of the first set of switches; and transmitting a second signal through the second set of switches when transmitting the second type of I/O signal;

wherein setting the first set of switches to accommodate the stacked transistor configuration and setting the first set of switches to accommodate the parallel transistor configuration are based upon the first operating voltage being greater than the second operating voltage.

18. The method of claim 17, wherein the first signal comprises a voltage level and wherein the first type of I/O signal is consistent with a 3.3V I/O signal.

19. The method of claim 17, wherein a bias circuit supplies a gate voltage to a gate of a transistor in one of the stacked transistor configuration or the parallel transistor configuration.

20. The method of claim 17, wherein the second signal is a pre-driver signal and wherein the second type of I/O signal is consistent with a below 3.3V I/O signal.

21. The method of claim 17, wherein the setting the first set of switches to accommodate a stacked transistor configuration comprises:
transmitting a third signal through a first switch in the first set of switches; and
receiving the third signal through a second switch in the first set of switches, wherein the third signal is a signal from a transistor.

22. The method of claim 17, wherein the setting the first set of switches to accommodate a parallel transistor configuration comprises:
transmitting a third signal through a first switch in the first set of switches, wherein the third signal is transmitted to an output pin; and
receiving a power supply through a second switch in the first set of switches.

23. The method of claim 22, wherein the power supply comprises a voltage level, and wherein the voltage level is transmitted through the second switch to a source of a transistor.

24. The method of claim 22, wherein the power supply comprises a ground potential, and wherein the ground potential is transmitted through the second switch to a drain of a transistor.

* * * * *